United States Patent [19]

Fujiwara et al.

[11] Patent Number: 4,735,847
[45] Date of Patent: Apr. 5, 1988

[54] ELECTRICALLY CONDUCTIVE ADHESIVE SHEET, CIRCUIT BOARD AND ELECTRICAL CONNECTION STRUCTURE USING THE SAME

[75] Inventors: Yoshio Fujiwara; Naotake Kobayashi; Yuichi Matsubara; Hisashi Ando; Hidehiro Numao; Kazuaki Suzuki, all of Tochigi, Japan

[73] Assignee: Sony Corporation, Tokyo, Japan

[21] Appl. No.: 61,608

[22] Filed: Jun. 22, 1987

Related U.S. Application Data

[63] Continuation of Ser. No. 686,457, Dec. 26, 1984, abandoned.

[30] Foreign Application Priority Data

Dec. 27, 1983 [JP] Japan ................. 58-250788
Feb. 10, 1984 [JP] Japan ................. 59-23882
Feb. 24, 1984 [JP] Japan ................. 59-33793

[51] Int. Cl.$^4$ .................. B32B 15/00; B32B 3/00
[52] U.S. Cl. .................. 428/209; 428/356; 428/328; 428/901
[58] Field of Search ............. 428/356, 328, 210, 209, 428/901

[56] References Cited

U.S. PATENT DOCUMENTS

| | | | |
|---|---|---|---|
| 3,740,366 | 6/1973 | Sandeison et al. | 428/356 X |
| 3,762,946 | 10/1973 | Stow et al. | 428/356 X |
| 3,778,306 | 12/1973 | Stow | 428/356 X |
| 4,258,100 | 3/1981 | Fujitani et al. | 428/356 X |
| 4,546,037 | 10/1985 | King | 428/356 X |
| 4,548,862 | 10/1985 | Hartman | 428/356 X |
| 4,680,226 | 7/1987 | Takeda | 428/901 X |

*Primary Examiner*—Nancy A. B. Swisher
*Attorney, Agent, or Firm*—Hill, Van Santen, Steadman & Simpson

[57] ABSTRACT

An electrically conductive adhesive sheet is disclosed which has an electrically conducting property across a thickness thereof and an electrically insulating property along a sheet surface direction. The electrically conductive adhesive sheet comprises an electrically insulating adhesive material and electrically conductive metal powder uniformly dispersed therein. The metal powder has a melting point lower than a certain working temperature, and is flattened by application of pressure between a pair of conductors between which the adhesive sheet is provided. The adhesive material is molten at the certain working temperature and is flown by application of pressure. The adhesive sheet is useful to electrically connect a pair of circuit boards each having a plurality of conductor patterns thereon by bonding corresponding ones through the metal powder as molten, while keeping the neighboring patterns insulated. The circuit board is mechanically integrated simultaneously by the adhesive sheet. The circuit board and the connection structure using such an adhesive sheet as above are also disclosed.

16 Claims, 9 Drawing Sheets

ELECTRICALLY CONDUCTIVE ADHESIVE SHEET, CIRCUIT BOARD AND ELECTRICAL CONNECTION STRUCTURE USING THE SAME

This is a continuation of application Ser. No. 686457 filed Dec. 26, 1984 now abandoned.

BACKGROUND OF THE INVENTION (1) Field of the Invention

The present invention relates to an electrically conductive adhesive sheet having an electrically conducting property across a thickness thereof, and an electrically insulating property along a direction of a surface thereof. The present invention further relates to a circuit board having such a electrically conductive adhesive sheet and an electrical connection structure using such an electrically conductive adhesive sheet.

(2) Prior Art of the Invention

Recently, electronic equipments and electronic parts have been made compact, and in association with this, it has been required to connect a plurality of conductive track patterns arranged on a circuit board, e.g., flexible circuit board or rigid circuit board at a fine pitch with another conductive track patterns arranged similarly on another flexible substrate for example at a fine pitch corresponding to the former conductive track patterns, or with a plurality of conductors such as lead terminals for IC, etc. arranged at a fine pitch. Such a connection as above is normally carried out by a so-called wire bonding with use of a gold wire. etc., or a soldering in association with dipping in solder, for example.

However, the wire bonding with use of the gold wire causes an awkward connection working and increase in cost because the gold wire itself is high in cost and collective connection of the wire is impossible. Further, there occurs a problem in reliability such that each of the wire is brought into contact owing to a fine pitch of a plurality of connection parts, or a connecting strength of bonding parts is reduced and the connection parts are short-circuited owing to reduction in width of the bonding pads.

In case of the dipping in solder, there similarly occurs a problem in reliability such that a solder is flown from the connection parts to cause an accident such as short-circuit between the connection parts due to a fine pitch thereof.

Further, there is another connecting method with use of a so-called zebra connector. According to the connecting method, insulators and conductors are alternately layered at a predetermined pitch to form a connector, which is in turn electrically interposed between conductors to be connected with each other and is mechanically pressed on both sides of the conductors to hold the connector. However, the zebra connector itself has no function to mechanically fix the conductors, and therefore it is difficult to maintain a predetermined width with a uniform pressure.

Further, there has been proposed another connection method wherein an adhesive layer prepared by alternately and stripedly coating a conductive hot-melt adhesive containing carbon fibers and an insulating hot-melt type adhesive is interposed between conductive track patterns and the corresponding conductors. However, reduction of a width of such a stripe as above is limited, and therefore this method is not suitable for connection of the conductive track patterns having a fine pitch. Further, it is awkward to manufacture such an adhesive layer.

Still another method is disclosed in Japanese Patent Publication 2223/72 published on Jan. 21, 1972. According to this method, wiring patterns are formed through a thermoplastic adhesive material on a substrate, and both substrates are bonded by heating under pressure with the molten adhesive material. However, there occurs a problem in reliability such that when the adhesive material is molten by heating, the wiring patterns are moved to cause a short-circuit between the patterns. Therefore, it is impossible to satisfactorily make the patterns with a fine pitch and a high density. At this time, as both the substrate are required to be bonded by deformation due to bending of the substrates, at least one of the substrates is required to be flexible. Additionally, there occurs a problem in reliability such that when a spacing of the patterns is small, sufficient bonding strength cannot be obtained, or in the case that patterns made of Cu foil are bonded to the substrate, a sufficient amount of adhesive material for filling a space between the patterns and bonding both the substrates cannot be obtained.

In yet further method, it is known to use a connecting sheet 1 as shown in FIG. 1. The connecting sheet 1 comprises a releasing sheet 5 and an adhesive layer 4 containing an electrically conductive fiber 3 such as carbon fiber arranged in one direction in an insulating adhesive material 2, which layer 4 is applied on the releasing sheet 5. The electrically conductive fiber 3 is mixed in an amount of 5–20 parts by volume, for example, with respect to 100 parts of volume of the adhesive material 2. A thickness of the sheet-like conductive layer 4 is set to 20–120 microns under unused condition prior to electrical connection of wirings as hereinafter described. A carbon fiber having a diameter of 5–50 microns and a length of 0.05–3 mm, for example, is used as the electrically conductive fiber.

As shown in FIG. 2 which is an enlarged plan view of FIG. 1 and as shown in FIG. 3 which is a cross section taken along the line A—A in FIG. 2, connection with use of the connecting sheet 1 is carried out by laying a plurality of conductive track patterns on another conductors, and interposing the insulating adhesive layer 4 as peeled off from the releasing sheet 1. In this example where a plurality of conductive track patterns 6 attached and arranged on a rigid substrate 8 are connected to the corresponding conductors 7, e.g., conductive track patterns attached and arranged on a flexible substrate 9, both the substrates 8 and 9 are layered in such a manner that both the conductive track patterns are extended in the same direction at connection parts thereof and are almost registered with each other. Then, as shown in FIG. 4 which is a cross section taken along the line B—B in FIG. 2, the adhesive sheet 5 of the connecting sheet 1, that is, the adhesive layer 4 containing an electrically conductive fiber 3 dispersed in the adhesive material 2, is provided over the layered parts of the conductive track patterns 6 and the conductors 7 in such a manner that the conductive fiber 3 is extended along the conductive patterns and the conductors 7. Then, both the substrates 8 and 9 are bonded as shown by arrows (a) and (b) by heating under pressure application from outside thereof. Thus, as shown in FIG. 5, the conductive track patterns 6 and the corresponding conductors 7 are electrically connected with each other by the conductive fiber 3. Further, the conductive fibers 3 are electrically insulated from each other by the adhesive material 2, and accordingly if a diameter of the conductive fiber 3 is set to a value sufficiently smaller than a spacing between adjacent connected portions, electrical connection due to the conductive fibers 3 between the adjacent connected portions may be avoided, and simultaneously both the substrates 8 and 9 may be mechanically strongly bonded with each other by the adhesive material 2.

According to this example, as the conductive track patterns and the corresponding conductors are electrically connected anisotropically in dependence upon direction of the conductive fibers 3, a shortcircuit between the connected portions may be avoided to improve reliability. In addition, as a plurality of conductive track patterns and the corresponding conductors are simultaneously connected with each other, it is superior in mass production. However, because the electrical connection is carried out through carbon which has a relatively large resistance, there will sometimes occur a problem with respect to high resistance when current flows through the connected portions, though it is not a big problem when mainly voltage is applied to the connected portions with small current therethrough.

Such an adhesive material containing the conductive fibers or a connecting method using the adhesive sheet as mentioned above is disclosed in Japanese Published Unexamined patent application No. 138881/81 published Oct. 29, 1981 or European patent application Publication No. 0068739 published May 1, 1983.

OBJECT AND SUMMARY OF THE INVENTION

It is an object of the present invention to provide a novel electrically conductive adhesive sheet which overcomes the drawbacks of the prior art.

It is another object of the present invention to provide an electrically conductive adhesive sheet which has an electrically conducting property across a thickness thereof and an electrically insulating property along a direction of a surface thereof.

It is a further object of the present invention to provide an electrically conductive adhesive sheet suitable for electrically connecting a pair of a plurality of electrically conductive tracks with each other and simultaneously mechanically integrating them with each other.

It is a still further object of the present invention to provide a circuit board having a novel electrically conductive adhesive sheet.

It is yet a further object of the present invention to provide an electrical connection structure employing an electrically conductive adhesive sheet.

The electrically conductive adhesive sheet according to the present invention has an electrically conducting property across a thickness thereof and an electrically insulating property along a direction of a surface thereof. The adhesive sheet contains a uniform dispersion of electrically conductive metal powder which is electrically insulated from each other by an electrically insulating adhesive material. The metal powder has a melting point lower than a predetermined working temperature and may be flattened by a predetermined working pressure. The adhesive material is capable of being molten and flown at the working temperature and under the working pressure.

The circuit board according to the present invention comprises an insulating substrate, a first set of a plurality of electrically conductive tracks formed on the substrate, and an electrically conductive adhesive sheet provided on the conductive tracks at least over an area where a second set of a plurality of electrically conductive tracks are to be electrically connected to the first set of conductive tracks. The electrically conductive sheet has an electrically conducting property across a thickness thereof and an electrically insulating property along a direction of a surface thereof, the adhesive sheet serving to electrically connect the first set of a plurality of electrically conductive tracks with the second set of a plurality of electrically conductive tracks to be connected with each of the electrically conductive tracks of the first set, and also serving to mechanically integrating the first and the second set of a plurality of electrically conductive tracks. The adhesive sheet contains a uniform dispersion of electrically conductive metal powder in an electrically insulating adhesive material, and each of the metal powder is electrically insulated by the adhesive material. The metal powder has a melting point lower than a certain elevated working temperature and may be flattened by a certain working pressure as applied between the first and the second set of conductive tracks. The adhesive material is capable of being molten and flown at the working temperature and under the working pressure. The metal powder has a particle size small enough not to bridge any neibouring pair of the conductive tracks when flattened by application of the working pressure, and the metal powder and the adhesive material are solidified after cooled to room temperature.

The electrical connection structure according to the present invention comprises a first set of a plurality of electrically conductive tracks formed on a substrate, a second set of a plurality of conductive tracks, and an electrically conductive adhesive sheet having an electrically conducting property across a thickness thereof and an electrically insulating property along a direction of a surface thereof. The adhesive sheet contains a uniform dispersion of electrically conductive metal powder which is electrically insulated from each other by an electrically insulating adhesive material. The metal powder is molten and flattened, and acts to electrically connect each of the conductive tracks of the first set with each of the conductive tracks of the second set under a surface-contact condition upon application of a certain elevated working temperature higher than a melting point of the metal powder and a certain working pressure as applied between the first and the second set of the conductive tracks. The adhesive material is molten, flown and partly expelled between the first and the second set of the conductive tracks by heating under pressure to mechanically integrate the first and the second set of the conductive tracks. The metal powder and the adhesive material are solidified after cooled to room temperature.

DESCRIPTION OF THE PREFERRED EMBODIMENTS

Figure 1:
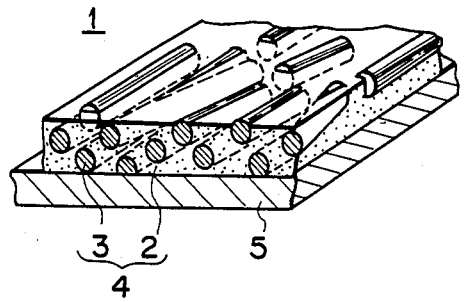
FIG. 1 is an enlarged perspective view of an essential part of a conventional connecting sheet for explanation of the present invention.
Figure 2:
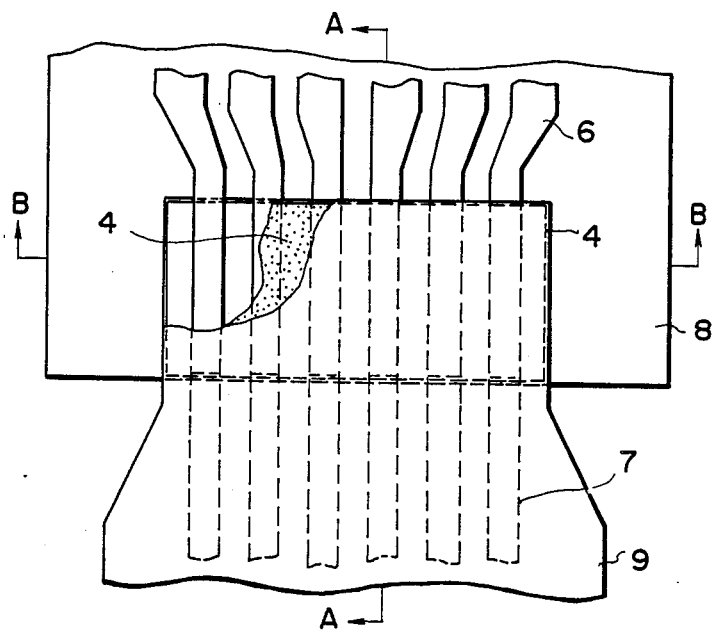
FIG. 2 is an enlarged plan view of an essential part of a conventional circuit board.
Figure 3:
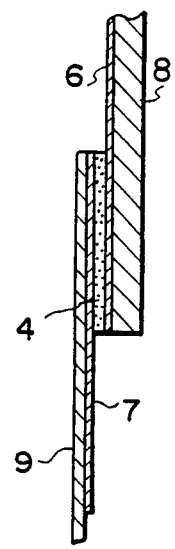
FIG. 3 is a cross section taken along the line A—A in FIG. 2.
Figure 4:
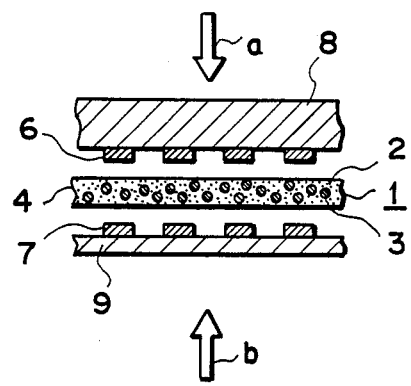
FIGS. 4 and 5 are enlarged cross sections taken along the line B—B in FIG. 2, for explanation of connection between the circuit board and the connecting sheet.
Figure 5:
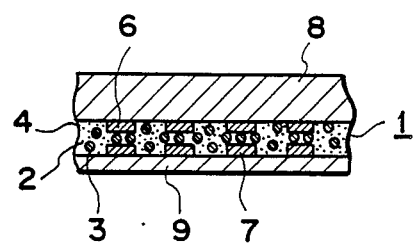

The present invention comprises an insulating adhesive layer employable for electrical connection of a plurality of conductive track patterns arranged on a substrate with a plurality of conductors corresponding to the conductive track patterns. The adhesive layer is interposed between the conductive track patterns and the conductors, so as to electrically and mechanically connect both the patterns and the conductors. The adhesive layer contains a metal powder dispersed in an insulating adhesive material. The metal powder comprises a metal fusible by heating under pressure upon connection between the conductive track patterns and the conductors. A particle size of the metal powder is preferably smaller than a spacing between the conductive track patterns and the conductors to be connected with each other. The insulating adhesive material is selected from adhesive materials capable of being molten and flown by heating.

The circuit board of the present invention comprises a substrate which includes a plurality of conductive track patterns arranged thereon to be connected to the other corresponding conductors, and an adhesive layer containing a metal powder dispersed in an insulating adhesive material for covering at least connected portions between the conductive track patterns and the conductors. The metal powder comprises a metal fusible by heating under pressure upon connection between the conductive track patterns and the conductors. A particle size of the metal powder is preferably smaller than a spacing between the conductive track patterns and the conductors to be connected with each other. The insulating adhesive material is selected from adhesive materials capable of being molten and flown by heating.

The electrical connection structure of the present invention comprises a substrate including a plurality of conductive track patterns arranged thereon, and a plurality of conductors to be electrically connected to the conductive track patterns corresponding thereto, and further comprises an adhesive layer interposed between the conductive track patterns and the conductors as layered, which layer is formed into a sheet or is prepared by a coating method, and contains a metal powder dispersed in an insulating adhesive material. The insulating adhesive material of the adhesive layer between the conductive track patterns and the corresponding conductors is partially expelled outside by heating under pressure, and accordingly the conductive track patterns and the corresponding conductors are electrically connected by molten metal powder, while simultaneously the conductors are fixed to the substrate by the insulating adhesive material.

A heating temperature upon connection of the patterns and the conductors, that is, a melting point of the metal powder is preferably 50–360° C. and more preferably 80–260° C. This is due to the fact that at ambient temperatures lower than 50° C., preferably 80° C. under mounted condition of the circuit board in an electronic equipment, or during use thereof, there is a possibility of reduction in reliability occurring such that the metal bonding the conductive track patterns and the conductors is re-molten to generate separation and connection failure. On the other hand, it is difficult to select a substrate material durable against a heating treatment at temperatures higher than 350° C., preferably 260° C., and a heating means and operation are troublesome at these temperatures, which causes industrial disadvantages.

The particle size of the metal powder is preferably selected to a value not more than half of a spacing between adjacent connected portions of the conductive track patterns and the corresponding conductors, that is, a spacing between adjacent conductive track patterns or adjacent conductors, thereby securely avoiding an accident such that the adjacent connected portions are short-circuited by the metal powder.

A mixing ratio between the adhesive material in the adhesive layer, which is preliminarily formed into a sheet or is preliminarily applied to the substrate and is interposed between the conductive track patterns and the corresponding conductors, and the metal powder is such that preferably 0.5–50 parts by volume of the metal powder are mixed with 100 parts by volume of the adhesive material (solid content). This is due to the fact that if content of the metal powder is not more than 0.5 parts by volume, low resistance connection is not sometimes satisfied, while if the content exceeds 50 parts by volume, insulation between each of the metal powder at unconnected portions is not sometimes completely established, or a mechanical adhesion strength is not sometimes satisfied.

The low m.p. metal powder used in the present invention is typically a so-called solder metal powder composed of Pb-Sn alloy. The solder metal powder may contain Cd and Bi in addition to such a mother alloy composed of Pb and Sn for purpose of reducing a melting point thereof.

In the present invention, either of the conductive tracks to be connected with each other may be transparent conductive film. The transparent conductive film is generally formed of ITO (Indium-Tin-Oxide). As a solder is generally hard to directly stick to the ITO, it is preferable to plate a metal having good affinity to the solder, e.g., gold on the connected portions only of the transparent conductive film formed of ITO.

In the case that the metal powder contains the Pb-Sn mother alloy and an additive of Zn and at least one of the rare earth elements, that is Sc, Y, La, Ce, Pr, Nd, Pm, Sm, Eu, Gd, Tb, Dy, Ho, Er, Tm, Yb and Lu, the transparent conductive film of metal oxide may be directly soldered without necessity of gold plating.

In both cases as above mentioned, the low m.p. metal powder may contain a small amount of Sb for improvement in water resistance, Al for preventing of oxidation, and Si, Ti, Se, etc. for prevention of hazing.

The insulating adhesive material of the present invention is selected from adhesives having fluidity at least once upon connecting operation by heating under pressure, for example, a so-called hot-melt type such as rubbers, or ethylene vinylocetate series copolymers or a thermosetting type epoxy adhesives capable of cross-linking by heating.

As to electrical characteristics of the insulating adhesive material, resistivity thereof is preferably not less than $10^7$ ohm.cm, and more preferably not less than $10^9$ ohm.cm. Further, fluidity of the adhesive material is preferably not less than 0.001 of M.F.I. (Melt Flow Index) at a working temperature for connection operation, and more preferably not less than 0.005, wherein M.F.I. indicates the number of gram or resin flowing out of an orifice for 10 minutes when a predetermined bonding temperature by using a device as defined in ASTM, D1238 A or JIS, K7210 A. Further, a thickness of the insulating adhesive layer is preferably 5-200 microns.

When a pair of conductors to be connected with each other are bonded, there is created a space between the substrate holding the conductors, except an area occupied by the conductors. In this case, a thickness of the insulating adhesive layer is preferably set to a thickness corresponding to 10-300%, and more preferably 30-200% of a volume of the space.

According to the present invention, the insulating adhesive layer containing the low m.p. metal powder is interposed between both conductors to be connected with each other, and the conductors are bonded by heating under pressure. The low m.p. metal powder is molten with heat, and the insulating adhesive material is also molten and flown with heat. As both the conductors are pressurized with heat, the adhesive material existing between the conductors is expelled from the portions between the opposing conductors. Further, a part of the metal powder existing between the conductors is expelled from the portions between the opposing conductors together with the adhesive material, and the metal powder as caught by both the conductors is almost depressed and melt-bonded to the conductors in surface-contact manner.

The low m.p. metal powder may include an oxide film on a surface of each powder. In this case, even if the metal powder as expelled from the portions between the opposing conductors is in contact with each other, there is no accident such that adjacent conductive track patterns are electrically connected because an electrically insulating oxide film is formed on the metal powder. On the other hand, since the metal powder as caught by both the conductors is depressed by the pressure and thereby the oxide film on the surface thereof is broken, the metal is molten to be bonded to desired conductors.

The present invention will be described below in more detail with reference to the preferred embodiments.

EXAMPLE 1

Figure 6:
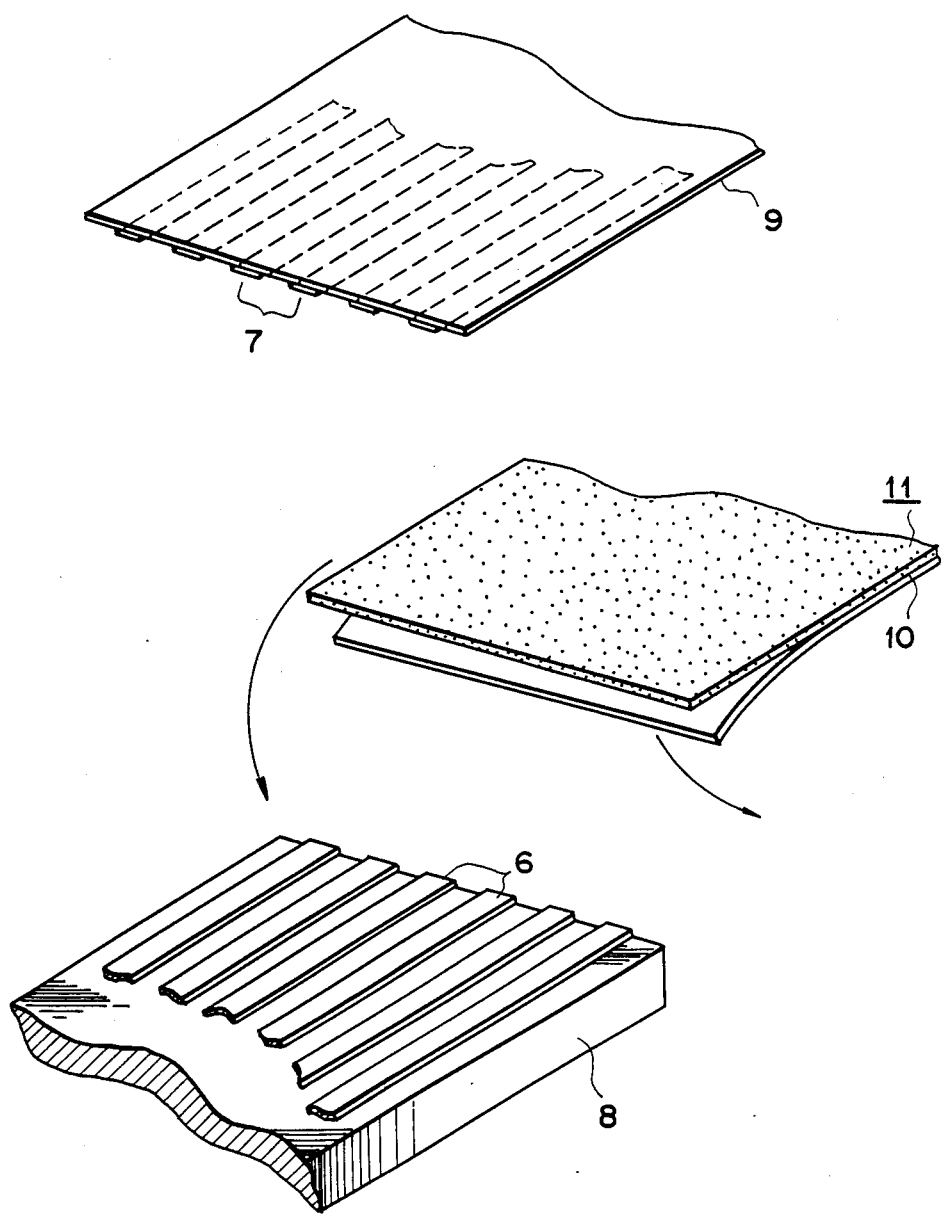
FIG. 6 is an exploded and enlarged perspective view of an essential part of a circuit board of a first embodiment according to the present invention.

As shown in FIG. 6, Cu foil having a thickness of 18 microns attached on a so-called glass cloth epoxy substrate 8, which is a glass cloth substrate impregnated with epoxy resin, was selectively etched to form a plurality of belt-like electrically conductive track patterns 6 arranged in parallel relation with each other at a pitch of 0.2 mm (width of 0.1 mm and spacing of 0.1 mm.) On the other hand, by using a sheet-like flexible substrate 9 having a thickness of 50 microns, a plurality of electrically conductive track patterns of Cu foil having the same size as the above-mentioned electrically conductive track patterns 6 were formed as electrical conductors 7. Further, a connecting sheet consisting of a releasing sheet 10 and an adhesive layer 11 coating on the releasing sheet 10 was prepared. The adhesive layer 11 was prepared by using a coating material containing a solder metal powder 13 dispersed in a hot-melt type electrically insulating adhesive material 12. Composition of the insulating adhesive material was as follows:

| | |
|---|---|
| Styrene-butadiene copolymer (Solprene by Asahi Chemical Industry Co., Ltd.) | 50 (parts by weight) |
| Terpene phenol resin (YS Polyster T130 by Yasuhara Yushi Kogyo Co., Ltd.) | 50 (parts by weight) |
| Toluene | 150 (parts by weight) |
| MEK (Methylethylketone) | 50 (parts by weight) |

Figure 7:
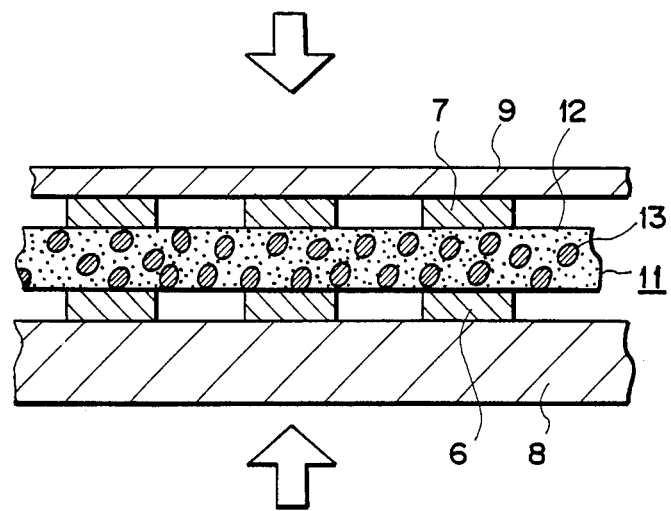
FIGS. 7 and 8 are enlarged sectional views of the essential part of FIG. 6.
Figure 8:
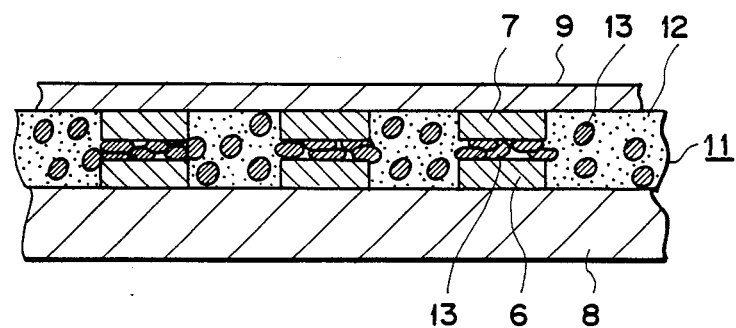

A solder metal powder having a low melting point of 10 parts by volume with respect to 100 parts by volume of solid content of the insulating adhesive material was dispersed in the insulating adhesive material having the above composition. A solder metal powder, a melting point of which was set to 140° C. by adding Sb and Bi to Pb-Sn alloy, having an average particle size of 20 microns was used as the metal powder. The adhesive coating material containing the low melting point solder metal powder 13 dispersed in the insulating adhesive 12 as prepared above was applied on the releasing sheet 10 with a coater so that a thickness of the sheet after dried may be 40 microns to obtain a connecting sheet. Then, the releasing sheet 10 of the connecting sheet as obtained above was peeled off, and the adhesive layer 11 was laid on all the parts of the conductive track patterns 6 on the substrate 8 to be connected to the conductors 7. Then, as shown in FIG. 7, the flexible substrate 9 was laid on the adhesive layer 11 in such a manner that each of the conductors 7 is registered with each of corresponding conductive track patterns 6 through the adhesive layer 11 with respective parts to be connected extending in the same direction. Then, both the substrates were bonded at 180° C. under pressure of 40 kg/cm$^2$ for 30 sec. At this time, as the adhesive material 12 in the adhesive layer 11 is flown by heating, and the conductive track patterns 6 and the conductors 7 are substantially projected from opposite surfaces of both the substrates 8 and 9, the insulating adhesive material 12 interposed between the conductive track patterns 6 and corresponding conductors 7 is almost expelled sidewardly, and as shown in FIG. 8, the solder metal powder 13 between the conductive track patterns 6 and the conductors 7 is molten and depressed by heating under pressure, and accordingly the conductive track patterns 6 and the conductors 7 are soldered to each other to be electrically connected. Such a circuit board as prepared above where the conductive track patterns 6 are connected with the conductors 7 had a connection resistance at the connected portions, that is, an actual value of the connection resistance not more than 0.1 ohm between the conductors 7 and the corresponding conductive track patterns 6, while having an insulation resistance not less than $10^{10}$ ohm between adjacent connected portions. The circuit board was treated by forced aging at 130° C. for one week, and thereafter the resistance of the circuit board was measured. Resultantly, the connection resistance was not more than 0.1 ohm, and the insulation resistance was not less than $10^{10}$ ohm. Thus, there occurred no change in its characteristics.

In this manner, the reason why the connection resistance at the connected portions may be rendered sufficiently small and the insulation resistance between adjacent connected portions may be rendered sufficiently large is considered to result from the fact that the insulating adhesive material 12 which has been rendered largely fluidic by heating under pressure is expelled from an area between the patterns 6 and the conductors 7, and both the members 6 and 7 are well bonded by the molten solder metal powder 13, while the insulating adhesive material 12 as expelled well encloses the metal powder 13 having electrical conductivity, and a large amount of the adhesive material 12 existing between adjacent connected portions serves to strongly fix both the substrates 8 and 9.

EXAMPLE 2

In the same procedure as of the Example 1, a circuit board was obtained, except that composition of the insulating adhesive material for the adhesive layer 11 of the connecting sheet was as follows:

| | |
|---|---|
| Acrylic rubber (Teisan Rubber #5001 by Teikoku Chemical Industry) | 45 (parts by weight) |
| Epoxy resin (GY 260 by Ciba Geigy Japan) | 50 (parts by weight) |
| Polyvinyl phenol (Resin M by Mauzen Petrochemical Co., Ltd.) | 4.5 (parts by weight) |
| Undecylimidazole (By Shikoku Fine Chemicals Co., Ltd.) | 0.5 (parts by weight) |
| MEK | 100 (parts by weight) |
| Toluene | 100 (parts by weight) |
| Ethanol | 50 (parts by weight) |

With respect to 100 parts by volume of solid content of the insulating adhesive material as above, 12 parts by volume of solder metal powder (Pb-Sn alloy; melting point of 230° C.) having an average particle size of 40 microns was mixed and dispersed in the insulating adhesive material to prepare an adhesive coating material, and then the coating material was applied onto the releasing sheet 10 so that a thickness of the adhesive layer 11 after dried may be 30 microns to obtain a connecting sheet. On the other hand, a polyimide substrate having a thickness of 25 microns was used as the flexible substrate 9. The conductive track patterns 6 on the substrate 8 and the conductors 7 on the substrate 9 were prepared by selectively etching Cu foil having a thickness of 35 microns at a pitch of 1.0 mm (width of 0.5 mm; spacing of 0.5 mm). The releasing sheet 10 on the connecting sheet was peeled off, and the adhesive layer 11 was interposed between the conductive track patterns 6 on the substrate 8 and the conductors 7 on the substrate 9. Then, both the substrates were bonded at 260° C. under 50 kg/cm² for 15 sec. to obtain a circuit board. The circuit board had a connection resistance not more than 0.1 ohm at connected portions between the conductive track patterns 6 and the conductors 7, while having an insulation resistance not less than $10^{10}$ ohm between adjacent connected portions. Further, after forced aging treatment of the circuit board at 150° C. for one week, the connection resistance was not more than 0.1 ohm and the insulation resistance was not less than $10^{10}$ ohm.

Although the above-mentioned examples are applied to connection of each of the wiring patterns on the substrates 8 and 9, they are also applicable to a so-called direct bonding where a terminal conductor on electronic parts, e.g., a semiconductor integrated circuit (IC) is directly, e.g., electrically or mechanically connected and mounted on a so-called film carrier tape or a circuit board which is formed by attaching wiring patterns or circuit wiring patterns for deriving a terminal lead on a flexible substrate.

In the following Example 3, there will be described a case that IC parts are direct-bonded on a film carrier tape.

EXAMPLE 3

Figure 9:
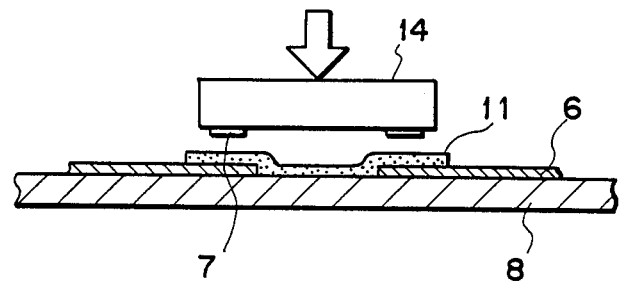
FIG. 9 is an enlarged sectional view of a second embodiment according to the present invention.

As shown in FIG. 9, IC parts 14 having terminal conductors 7 on one surface thereof were bonded on a film carrier tape. The film carrier tape is formed by selectively etching Cu foil having a thickness 18 microns as attached on a flexible substrate 8 of polyimide to make conductive track patterns 6 for deriving a plurality of terminal leads. In this example, a connecting sheet was also prepared. Composition of an insulating adhesive material for the connecting sheet was formulated as follows:

| | |
|---|---|
| Acrylonitrile-butadiene copolymer (Hycar 1001 by Nippon Zeon Co., Ltd.) | 70 (parts by weight) |
| Phenol resin (BKR 2620 by Showa Union Gosei Co., Ltd.) | 70 (parts by weight) |
| MEK | 300 (parts by weight) |

With respect to 100 parts by volume of solid content of the insulating adhesive material as above obtained, 7 parts by volume of solder metal powder containing Pb-Sn alloy and an additive of Sb and Bi, having a melting point of 140° C. and an average particle size of 20 microns were mixed and dispersed in the insulating adhesive material to obtain an adhesive coating material. Then, the adhesive coating material was applied on a releasing sheet so that a thickness of an adhesive layer after dried may be 10 microns. Then, the releasing sheet on the connecting sheet was peeled off, and the adhesive layer 11 was disposed on a part on the substrate 8 to be bonded to the IC parts 14. Thereafter, the IC parts 14 were laid through the insulating adhesive layer 11 on the conductive track patterns 6 on the substrate 8 for deriving the terminal leads which patterns 6 corresponds to the terminal conductors 17 on the IC parts 14, and then both the members 14 and 8 were bonded at 150° C. under 30 kg/cm² for 10 sec. In the same manner as in FIG. 8, the terminal conductors 7 on the IC parts 14 and the conductive track patterns 6 for deriving the terminal leads of the film carrier tape are bonded by molten solder metal powder 13 and are electrically and mechanically connected with eath other. Simultaneously, the IC parts 14 and the substrate 8 are mechanically connected by the adhesive material filled between adjacent connected portions, and the adjacent connected portions are insulated by the adhesive material.

EXAMPLE 4

Figure 10:
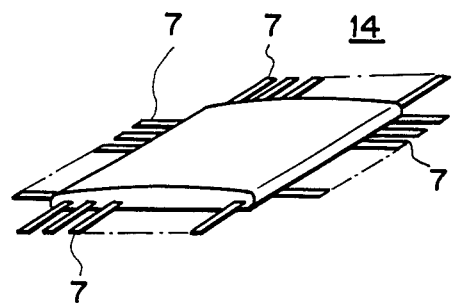
FIG. 10 is an enlarged perspective view of exemplary parts of a third embodiment.
Figure 11:
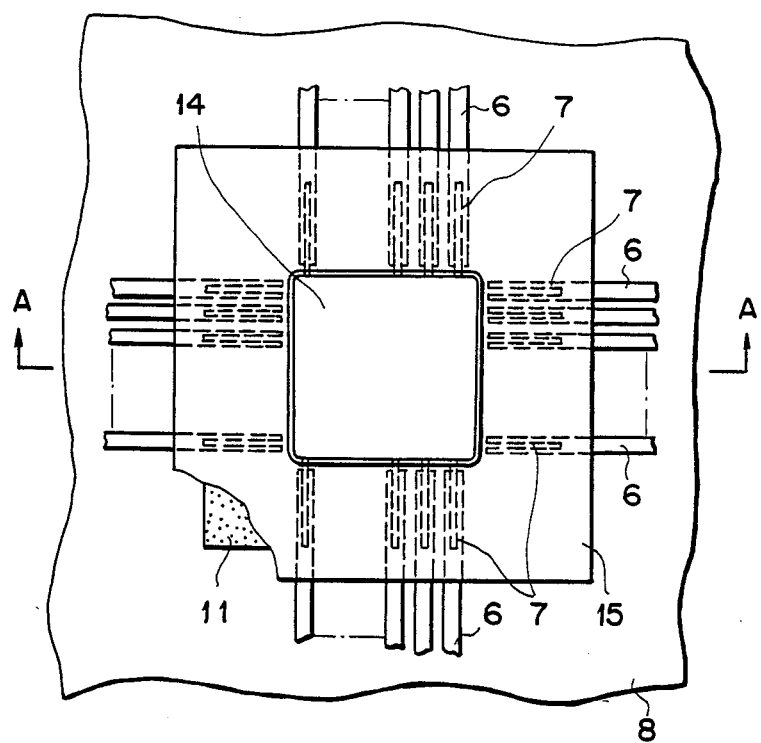
FIG. 11 is an enlarged plan view of a fourth embodiment.
Figure 12:
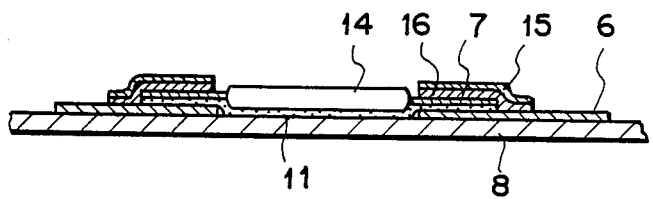
FIG. 12 is a cross section taken along the A—A in FIG. 11.

Similarly to Example 3, a connecting sheet was employed, however, as shown in FIG. 10, IC parts 14 which are a so-called flat-package IC having a structure such that conductors 7 such as lead legs are derived outwardly projectingly from the IC parts were used. As shown in FIGS. 11 and 12, the conductors 7 of the IC parts 14 were layered through an adhesive layer 11 of the connecting sheet onto corresponding conductive track patterns 6 on a substrate 8 or a film carrier tape. Then, a cover film, namely a frame-like cover film 15 formed of a polyimide film and a lower surface of which is coated with an adhesive material 16 was entirely laid on the layered portions, and then the IC parts and the substrate were bonded to each other by heating under pressure to obtain a circuit board. In the circuit board, as similar to the previous examples, the connected portions between the conductive track patterns 6 and the conductors 7 were bonded with molten solder metal powder, and the areas between adjacent connected portions between the cover film 15 and the substrate 8 were filled with the adhesive material 16, which acts to strongly bond both the members 15 and 8, and simultaneously acts to secure electrical insulation between the connected portions.

EXAMPLE 5

Conductive track patterns of Cu foil on flexible substrate formed of polyimide were connected to transparent electrode conductors arranged on a glass substrate at a pitch of 0.4 mm (width of 0.2 mm; spacing of 0.2 mm) with the adhesive layer 11 of the connecting sheet same as in Example 1 interposed therebetween by heating at 180° C. under 40 kg/cm$^2$ for 30 sec. The transparent electrode conductors were formed of a composite oxide of In and Sn. A gold plating having good affinity to a solder metal was preliminarily attached on the connected portions. Similarly, good electrical connection between the transparent electrode conductors and the conductive track patterns was achieved with a connection resistance not more than 0.1 ohm, while an insulation resistance between adjacent connected portions was maintained at a value not less than 10$^7$ ohm.

In the previously mentioned examples, the connecting sheet was interposed between the conductive track patterns and the conductors upon bonding, however it is also possible to preliminarily attach an adhesive layer formed by dispersing metal powder in the above-mentioned insulating adhesive material directly on the substrate. In this case, the adhesive layer may be employed as a protective film which acts to entirely cover the connected portions of the conductive track patterns on the substrate as well as the other areas including unconnected portions. In another way, the adhesive layer may be locally attached on the areas between each of a plurality of connected portions as arranged.

Attachment of the adhesive layer may be carried out by various methods, for example, by applying the adhesive material with a brush coating or various coaters such as a roll coater and a knife coater, etc., or by sticking a sheet-like adhesive layer onto the substrate.

Such case as above was embodied by the following example.

EXAMPLE 6

| | |
|---|---|
| Polyester resin (Vylon #300 by Toyobo Co., Ltd.) | 60 (parts by weight) |
| Polyester (Vylon #200 by Toyobo Co., Ltd.) | 40 (parts by weight) |
| Tolune | 120 (parts by weight) |
| MEK | 60 (parts by weight) |

With respect to 100 parts by volume (solid content) of insulating adhesive material having the above composition, 12 parts by volume of low melting point solder powder (containing Pb-Sn alloy and an additive of Sb and Bi) having a melting point of 140° C. and an average particle size of 20 micron were mixed and dispersed in the insulating adhesive material. Then, the insulating adhesive material was entirely applied onto a polyimide substrate having a thickness of 25 microns, on which a plurality of conductive track patterns of Cu foil were arranged at a pitch of 0.4 mm (width of 0.2 mm; spacing of 0.2 mm) so that a thickness after dried may be 30 microns, thus obtaining a circuit board. Then, each one end of the conductive track patterns of the circuit board was layered on the transparent electrodes as mentioned in Example 5, while the other ends were layered on wiring patterns on the other circuit boards, and then were bonded at 180° C. under 40 kg/cm$^2$ for 30 sec. Resultantly, each of the connected portions exhibited good electrical connection.

EXAMPLE 7

| | |
|---|---|
| Acrylic rubber (Tesan Rubber #5001 by Teikoku Chemical Industry) | 45 (parts by weight) |
| Epoxy resin (GY 260 by Ciba Geigy Japan) | 50 (parts by weight) |
| Polyvinyl phenol (Resin M by Maruzen Petrochemical Co., Ltd.) | 4.5 (parts by weight) |
| Undecylimidazole (By Shikoku Fine Chemicals Co., Ltd.) | 0.5 (parts by weight) |
| MEK | 100 (parts by weight) |
| Toluene | 100 (parts by weight) |
| Ethanol | 50 (parts by weight) |

Figure 13:
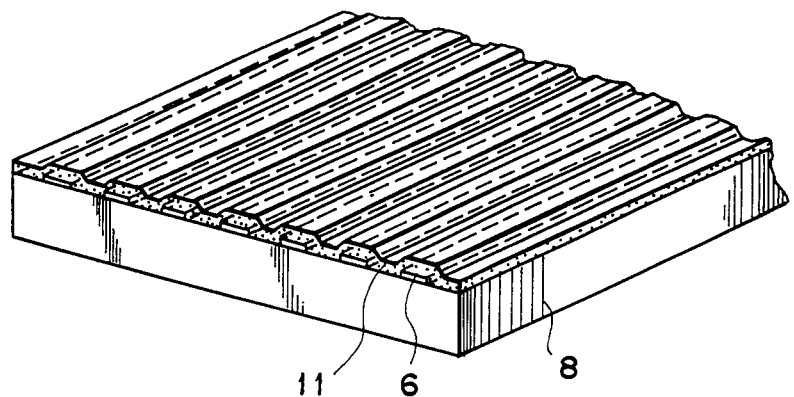
FIG. 13 is an enlarged perspective view of an exemplary circuit board according to the present invention.

With respect to 100 parts by volume of solid content of insulating adhesive material having the above composition, 16 parts by volume of solder metal powder (melting point of 230° C.) having an average size of 40 microns were mixed and dispersed in the insulating adhesive material to obtain an adhesive coating material. The coating material was applied onto a releasing sheet so that a thickness of an adhesive layer 11 may be 30 microns. The adhesive layer 11 was laid on a glass epoxy substrate 8 formed by impregnating glass fibers with epoxy resin in such a manner that conductive track patterns 6 as formed by etching Cu foil attached on the glass epoxy substrate 8 were entirely covered with the adhesive layer 11, and then was sticked onto the substrate 8 at 100° C. as shown in FIG. 13. The releasing sheet is peeled off, and as mentioned in Example 3, the IC parts 14 were direct-bonded onto the patterns on the substrate at 200° C. under 50 kg/cm$^2$ for 15 sec. Similarly, good connection was achieved.

EXAMPLE 8

| | |
|---|---|
| Polyester (Vylon #300) | 60 (parts by weight) |
| Polyester (Vylon #200) | 40 (parts by weight) |
| Xylene | 80 (parts by weight) |
| MEK | 20 (parts by weight) |

With respect to 100 parts by volume (solid content) of insulating adhesive material having the above composition, 10 parts by volume of low m.p. solder metal powder having a melting point of 150° C. and an average particle size of 10 microns were mixed and dispersed in the insulating adhesive material. Then, an adhesive layer formed of the insulating adhesive material was selectively attached on connected portions between conductive track patterns of Cu foil and parts leads on a polyimide flexible substrate of 25 microns thickness having the conductive track patterns thereon by using a silk screen printing technique. In the same manner as of Example 3, the IC parts were laid through the adhesive layer on the substrate, and were directbonded to the substrate at 200° C. under 40 kg/cm² for 10 sec. Similarly, good connection was achieved.

EXAMPLE 9

An oxide transparent conductive film (thickness of 1000Å) formed of composite oxide composed of indium oxide and tin oxide was patterned on a transparent glass substrate to provide transparent striped electrode patterns as arranged in parallel relation with each other. On the other hand, a copper foil of 18 microns thickness formed on a polyimide flexible substrate of 25 microns thickness was etched by a photolithography method to form striped conductive track patterns corresponding to external lead connections of the above transparent conductive film. In this case, each of pitches of the transparent electrode patterns and the conductive track patterns was set to 0.4 mm (pattern width of 0.2 mm; pattern spacing of 0.2 mm).

In a coating material having the following composition, 110 parts by weight of solder alloy metal powder (m.p. 145° C.; particle size 20 microns) compounding 30 parts by weight of Tb, 45 parts by weight of Sn, 20 parts by weight of Cd, 3 parts by weight of Zn, and 2 parts by weight of Sb was uniformly dispersed.

| | |
|---|---|
| Acrylonitrile-butadiene copolymer (Hycar 1001 by Nippon Zeon Co., Ltd.) | 58 (parts by weight) |
| Epoxy acrylate (Lipoxy SP520X by Showa Highpolymer Co., Ltd.) | 40 (parts by weight) |
| Organic peroxide (Perhexa 2M by Nippon Oil & Fat Co., Ltd.) | 2 (parts by weight) |
| MEK | 100 (parts by weight) |
| Toluene | 100 (parts by weight) |

The coating material containing the above-mentioned metal powder was applied to a releasing sheet so that a thickness after dried may be 30 microns to obtain a sheet-like adhesive layer. The sheet-like adhesive layer was interposed between the transparent electrode patterns and the conductive track patterns between both the substrates, and then both the substrates were bonded at 180° C. under 40 kg/cm² for 20 sec. Such a connection structure where both the patterns were electrically and mechanically connected exhibited good electrical connection.

EXAMPLE 10

In a coating material having the following composition, 110 parts by weight of metal powder having a particle size of 20 microns of solder for glass ceramic bonding (Cerasolzer #143 (m.p. 143° C.) by Asahi Glass Co., Ltd.) was mixed and dispersed.

| | |
|---|---|
| Styrene butadiene rubber (Solprene 406 by Asahi Chemical Industry Co., Ltd.) | 50 (parts by weight) |
| Terpene phenol resin (YS Polyster T130 by Yasuhara Yushi Kogyo Co., Ltd.) | 50 (parts by weight) |
| Toluene | 150 (parts by weight) |
| MEK | 50 (parts by weight) |

The coating material dispersing the metal powder therein was applied to a releasing paper so that a thickness after dried may be 30 microns to obtain a sheet-like insulating adhesive layer in which the metal powder was dispersed. Then, the releasing paper was peeled off, and the insulating adhesive layer was interposed between both the patterns to be layered with each other in the same manner as in Example 9. Then, both the patterns were bonded at 180° C. under 40 kg/cm² for 20 sec. Resultantly, a connection resistance at the connected portions of both the patterns was not more than 10 ohm, while an insulation resistance at the areas between adjacent connected portions of both the patterns was not less than $10^{10}$ ohm. Further, even after a forced aging treatment at 100° C. for one week, the connection resistance was not more than 10 ohm, and the insulation resistance was not less than $10^{10}$ ohm.

EXAMPLE 11

In the coating material, 80 parts by weight of metal powder having a particle size of 10 microns of solder for glass ceramic bonding (Cerasolzer #123 (m.p. 123° C.) by Asahi Glass Co., Ltd.) were uniformly mixed and dispersed to obtain an adhesive coating material, and then the adhesive coating material was applied to a releasing paper so that a thickness after dried may be 20 microns to obtain an insulating adhesive layer in which the metal powder was dispersed. Then, the sheetlike insulating adhesive layer was separated from the releasing paper, and was interposed between the transparent electrode patterns and the conductive track patterns in the same manner as in Example 9 to bond both the patterns at 150° C. under pressure of 40 kg/cm² for 20 sec. In this example, each of pitches of the transparent electrode patterns and the conductive track patterns was set to 0.3 mm (pattern width of 0.15 mm; pattern spacing of 0.5 mm). In this case, even after a forced aging treatment at 80° C. and relative humidity of 95% for one week, there occur red no change in electrical connection resistance and insulation resistance.

EXAMPLE 12

A sheet-like adhesive layer including the same metal powder as in Example 10 was used, except that the composition of an adhesive material was formulated as follows:

| | |
|---|---|
| Acrylic rubber | 30 (Parts by weight) |

| | |
|---|---|
| (Tesan Rubber #5001 by Teikoku Chemical Industry) | |
| Epoxy resin | 60 (Parts by weight) |
| (GY 260 by Ciba Geigy Japan) | |
| Polyvinyl phenol | 9.5 (Parts by weight) |
| (Resin M by Maruzen Petrochemical Co., Ltd.) | |
| Undecylimidazole | 0.5 (Parts by weight) |
| (by Shikoku Fine Chemicals Co., Ltd.) | |
| MEK | 100 (Parts by weight) |

The insulating adhesive layer as obtained containing dispersed metal powder was interposed between both the patterns to be connected in the same manner as in Example 9, and was bonded at 300° C. and 60 KHz under pressure of 30 kg/cm² for 30 sec. by using an ultrasonic soldering device (Sunbonder by Asahi Glass Co., Ltd.). As the result, a connection resistance at the connected portions was not more than 5 ohm, and an insulation resistance between adjacent connected portions was not less than $10^{10}$ ohm.

EXAMPLE 13

A rigid substrate and flexible substrate similar to those in Example 1 were connected with each other by using a connecting sheet, wherein a pattern pitch was 0.3 mm (pattern width of 0.15 mm; pattern spacing of 0.15 mm).

The adhesive layer 11 of the connecting sheet 12 was prepared by dispersing a low m.p. melting point solder metal powder in a hot-melt type insulating adhesive material. Composition of the insulating adhesive material was as follows:

| | |
|---|---|
| Styrene-butadiene copolymer | 60 (parts by weight) |
| (Cariflex TRKX-65 by Shell Kagaku Kabushiki Kaisha) | |
| Terpene phenol resin | 40 (parts by weight) |
| (YS Polyster T115 by Yasuhara Yushi Kogyo Co., Ltd.) | |
| Toluene | 150 (parts by weight) |
| MEK | 50 (parts by weight) |

In the insulating adhesive material having the above composition, 100 parts by weight of low melting point solder metal powder was mixed so as to be uniformly dispersed therein. The metal powder was obtained by grinding Pb-Sn-Cd alloy in atmosphere with a grinder to an average particle size of 30 microns. An insulating oxide film was formed on a surface of the low melting point solder metal powder. A melting point of the Pb-Sn-Cd alloy was 143° C. An adhesive coating material as obtained by dispersing the low melting point solder metal powder in the insulating adhesive material was applied onto a releasing sheet so that a thickness after dried may be 40 microns to obtain the connecting sheet. Then, the releasing sheet was peeled off from the connecting sheet, and the adhesive layer was entirely laid on at least areas where the conductors were to be connected with the conductive track patterns on the substrate, and then as shown in FIG. 7, the flexible substrate 9 was laid on the lower substrate 8 in such a manner that the conductors 7 were layered through the adhesive layer 11 on the corresponding conductive track patterns 6 and that the connected portions were extended in the same direction. Then, both the substrates were bonded at 180° C. under pressure of 40 kg/cm² for 20 sec. At this time, as the adhesive material in the adhesive layer 11 is flown by heating, and the conductive track patterns and the conductors 7 are substantially projected from opposite surfaces of both the substrates 8 and 9, the insulating adhesive material interposed between the conductive track patterns 6 and corresponding conductors 7 is almost expelled sidewardly, and as shown in FIG. 8, the low melting point solder metal powder 13 between the conductive track patterns 6 and the conductors 7 is molten and depressed by heating under pressure. At this time, the oxide film formed on the surface of the low melting point solder metal powder 13 is broken by pressure, and accordingly the conductive track patterns 6 and the conductors 7 are soldered to each other to be electrically connected. Such a circuit board as prepared above where the conductive track patterns 6 are connected with the conductors 7 had a connection resistance at the connected portions, that is, an actual value of the connection resistance of 0.08 ohm between the conductors 7 and the corresponding conductive track patterns 6, while having an insulation resistance of $1.5 \times 10^{11}$ ohm between adjacent connected portions. In this case, the insulating oxide film is formed on the surface of the low melting point solder metal powder 13, and accordingly even if any solder metal powder which has not been molten and depressed was in contact with each other, an electrical resistance was remarkably large enough to be regarded as substantially insulated condition. The circuit board was treated by forced aging at 80° C. and relative humidity of 95% for one week, and thereafter the resistance of the circuit board was measured. As the result, the connection resistance was 0.1 ohm, and the insulation resistance was $8.0 \times 10^9$ ohm. Thus, even after such hard aging, its characteristics was kept satisfactorily.

In this manner, the reason why the connection resistance at the connected portions may be rendered sufficiently small and the insulation resistance between adjacent connected portions may be rendered sufficiently large is considered to result from the fact that the insulating adhesive material which has been rendered largely fluidic by heating under pressure is expelled from an area between the patterns 6 and the conductors 7, and both the members 6 and 7 are well bonded by the molten solder metal powder 13 after the oxide film thereon being broken, while the insulating adhesive material as expelled well encloses the metal powder 13 having electrical conductivity, and a large amount of the adhesive material existing between adjacent connected portions serves to strongly fix both the substrates 8 and 9.

EXAMPLE 14

Figure 16:
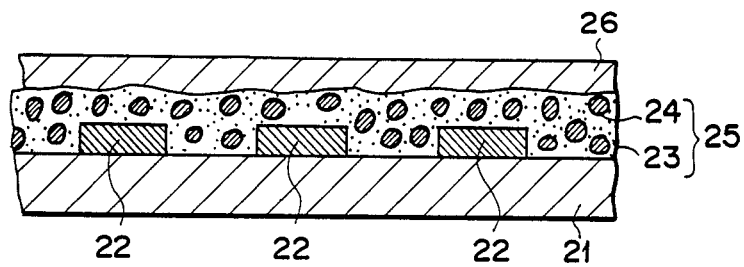
FIG. 16 is an enlarged sectional view of a sixth embodiment of the circuit board.

In FIG. 16, reference numeral 21 designates a so-called glass cloth epoxy substrate, and Cu foil of 18 microns thickness attached on the glass cloth epoxy substrate 21 was selectively etched to form a plurality of band-like conductive track patterns 22 as arranged in parallel relation with each other at a pitch of 0.3 mm (width of 0.15 mm; spacing of 0.15 mm), thus preparing a circuit board. A low melting point solder metal powder 24 having an oxide film as formed thereon was dispersed in a hot-melt type insulating adhesive material 23 to prepare an adhesive coating material, and then the coating material was applied onto the conductive track patterns 22 to form an adhesive layer 25. The insulating adhesive material 23 has the same composition as in Example 13. In the insulating adhesive material 23 having the composition, 100 parts by weight of the low melting point solder metal powder 24 was mixed and uniformly dispersed. The metal powder is the same as in Example 13. The adhesive coating material containing the low melting point solder metal powder 24 dispersed in the insulating adhesive material 23 was applied onto the conductive track patterns 22 with a coater so that a thickness after dried may be 40 microns to form an adhesive layer 25, and then a releasing paper 26 was attached on the adhesive layer 25.

Figure 17:
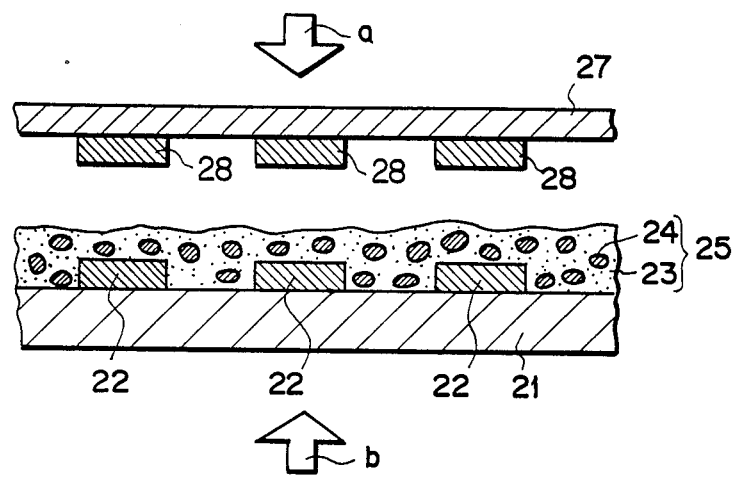
FIGS. 17 and 18 are enlarged sectional views for explanation of a connection mode according to the present invention.
Figure 18:
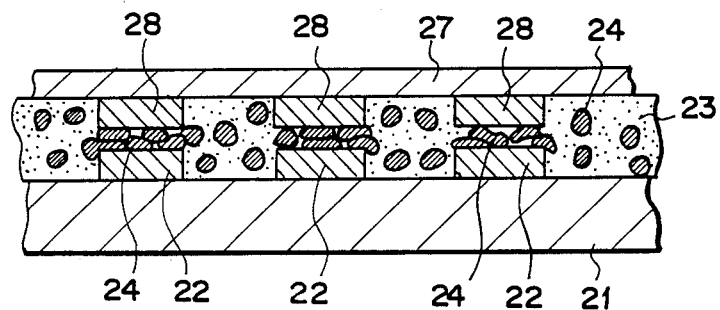

As shown in FIG. 17, when the conductive track patterns 22 are electrically connected to another conductive patterns 28 formed of Cu foil having the same size as that of the conductive track patterns 22 on a sheet-like polyimide flexible substrate 27 having a thickness of 50 microns, the releasing paper 26 is peeled off, and the conductive track patterns 22 and 28 on the substrates 21 and 27 are registered with each other, and are bonded at 180° C. under 40 kg/cm$^2$ for 20 sec. At this time, as the adhesive material 23 in the adhesive layer 25 is flown by heating as shown in Fig. 18, and the conductive track patterns 22 and 28 are substantially projected from opposite surfaces of both the substrates 21 and 27, the insulating adhesive material 23 interposed between the conductive track patterns 22 and 28 is almost expelled sidewardly, and the low melting point solder metal powder 13 between the conductive track patterns 22 and 28 is molten and depressed by heating under pressure. At this time, the oxide film formed on the surface of the low melting point solder metal powder 24 is broken by pressure, and accordingly the conductive track patterns 22 and 28 are soldered to each other to be electrically connected. Such a circuit board as prepared above where the conductive track patterns 22 and 28 are connected with each other had a connection resistance at the connected portions, that is, an actual value of the connection resistance of 0.08 ohm between the conductive track patterns 22 and the corresponding conductive track patterns 28, while having an insulation resistance of $1.5 \times 10^{11}$ ohm between adjacent connected portions. In this case, the insulating oxide film is formed on the surface of the low melting point solder metal powder 24, and accordingly even if any solder metal powder which has not been molten and depressed was in contact with each other, an electrical resistance was remarkably large enough to be regarded as substantially insulated condition. The circuit board was treated by forced aging at 80° C. and relative humidity of 95% for one week, and thereafter the resistance of the circuit board was measured. As the result, the connection resistance was 0.1 ohm, and the insulation resistance $8.0 \times 10^9$ ohm. Thus, even after the aging, its characteristics was kept satisfactorily.

Figure 19:
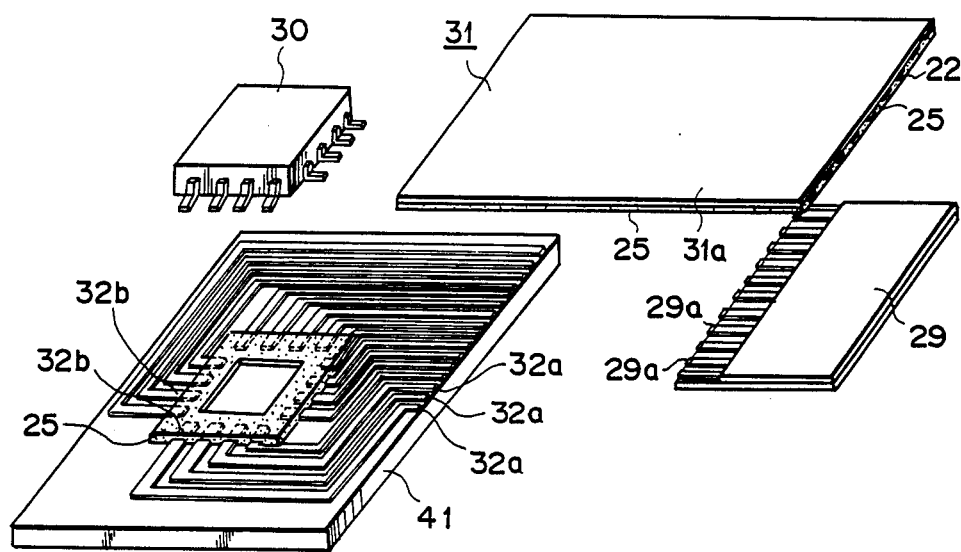
FIG. 19 is an exploded perspective view of an exemplary circuit board connection structure according to the present invention.
Figure 20:
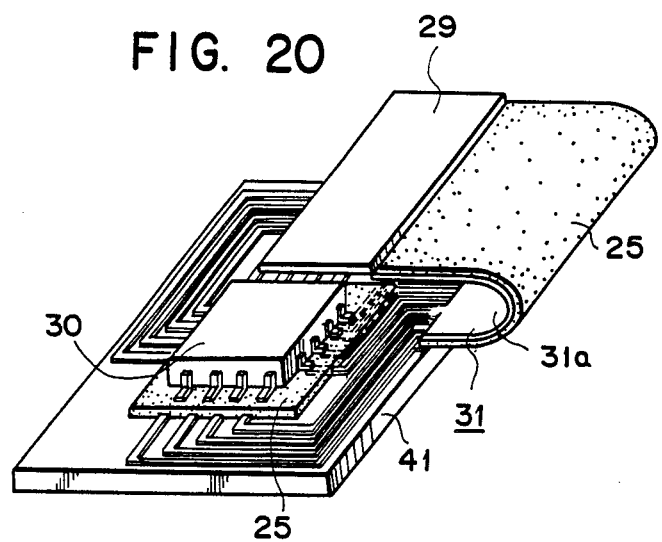
FIG. 20 is a perspective view of a connection mode in FIG. 19.

Referring next to FIGS. 19 and 20 which show a connecting mode where a liquid crystal display panel 29 having a plurality of terminals 29a is to be connected through a flexible substrate 31 to an IC 30 for driving the liquid crystal display panel 29, corresponding parts in FIGS. 16 to 18 are designated by the same reference numerals, and description relating thereto will be omitted.

Cu foil having a thickness of 18 microns was selectively etched on an insulating flexible substrate 31a of a polyimide film having a thickness of 25 microns to form a plurality of band-like conductive track patterns 22 arranged at a pitch of 0.4 mm, and then an adhesive layer 25 containing an insulating adhesive material having the following composition was entirely attached on the conductive track patterns 22 so that a thickness after dried may be 30 microns to form a flexible circuit board 31.

| | |
|---|---|
| Acrylic rubber (Teisan Rubber #5001 by Teikoku Chemical Industry) | 30 (parts by weight) |
| Epoxy resin (GY 260 by Ciba Geigy Japan) | 60 (parts by weight) |
| Polyvinyl phenol (Resin M by Maruzen Petrochemical Co., Ltd.) | 9.5 (parts by weight) |
| Undecylimidazole (By Shikoku Finechemicals Co., Ltd.) | 0.5 (parts by weight) |
| MEK | 100 (parts by weight) |

A solder for glass ceramic bonding (Cerasolzer #123 by Asahi Chemical Industry Co., Ltd.) was ground in the air by using a grinder to an average particle size of 20 microns to prepare a solder metal powder 24, and then 120 parts by weight of the solder metal powder 24 was mixed and uniformly dispersed in the insulating adhesive material having the composition. In this case, as the solder for glass ceramic bonding is ground in the air, an insulating oxide film is formed on a surface of the solder metal powder 24. A melting point of the glass ceramics bonding solder is 145° C.

One end of the flexible circuit board 31 was laid on the liquid crystal display panel 29 in such a manner that the conductive track patterns 22 of the circuit board 31 were oppositely laid through the adhesive layer 25 onto transparent electrodes (ITO) 29a arranged at a pattern pitch of 0.4 mm on the liquid crystal display panel 29. On the other hand, the other end of the flexible circuit board 31 was laid on a glass epoxy substrate 41 in such a manner that the conductive track patterns 22 were oppositely laid on connection terminals 32a formed on the glass epoxy cloth substrate 41 corresponding to the predetermined conductive track patterns 22. Then, as shown in FIG. 20, such layered portions were bonded at 150° C. under 50 kg/cm$^2$ for 15 sec. Resultantly, good electrical connection was achieved as described above. According to this example, it is advantageously possible to easily carry out electrical connection between a plurality of the conductive track patterns 22 and 29a as well as electrical connection between a plurality of the conductive track patterns 22 and 32a. Simultaneously, it is advantageously possible to mechanically connect both the substrates with the adhesive material 23. Further, since the adhesive material 23 of the adhesive layer 25 attached on the conductive track patterns 22 is an insulating material, and an insulating oxide film is formed on the surface of the solder metal powder 24, the adhesive layer 25 serves to insulate the conductive track patterns 22 from each other at unconnected portions and also serves to protect the conductive track patterns 22.

Next, in case of connection between the IC 30 and the glass cloth epoxy substrate 41 at a predetermined position, Cu foil having a thickness of 9 microns was preliminarily etched on the glass epoxy substrate 41 to form a predetermined conductive track patterns. Then, as shown in FIG. 19, an adhesive layer 25 as formed into a substantial square was attached on the connection terminals 32b of the conductive patterns on the IC 30. The adhesive layer 25 contains an insulating adhesive material having the following composition.

| | |
|---|---|
| Acrylonitrile-butadiene copolymer (Hycar 1001 by Nippon Zeon Co., Ltd.) | 60 (parts by weight) |
| Phenol resin (BKR 2620 by Showa Union Gosei Co., Ltd.) | 40 (parts by weight) |
| MEK | 300 (parts by weight) |

A low melting point solder (Pb-Sn-Cd alloy; melting point 143° C.) was ground in the air by using a grinder to an average particle size of 10 microns to prepare a low melting point solder metal powder 24 having an insulating oxide film on a surface thereof, and then 150 parts by weight of the metal powder was mixed and dispersed in the insulating adhesive material having the above composition.

The IC connection terminals 32b on the substrate 41 were registered through the adhesive layer 25 with terminals of the flat-package IC 30, and the registered portions were bonded at 180° C. under 40 kg/cm² for 10 sec. Similarly, good electrical and mechanical connection were achieved.

Although the above-mentioned example discloses that the adhesive layer 25 is directly attached on the circuit board, it should be appreciated that the adhesive layer 25 is attached on a releasing paper and the releasing paper having the adhesive layer 25 is attached on an entire surface or a predetermined part of the circuit board. Further, it should be appreciated that various modifications of the present invention may be permitted without departing from the scope of the invention.

As is above described, it will be understood that the present invention discloses a connection structure between a plurality of conductive track patterns such as wiring patterns and terminal deriving lead patterns and corresponding similar wiring patterns or conductors such as terminals and lead legs. In order to secure a mechanical strength of two substrates, a substrate and parts, or a substrate and a cover film interposing the wiring patterns and conductors therebetween and bonded with an adhesive layer filled in a space therebetween, and also secure an insulation resistance between adjacent connected portions of the patterns and conductors, it is preferred to use a flexible material for at least one of the substrates or the cover film interposing the space, so that the space may be substantially fully filled with the insulating adhesive layer.

Figure 14:
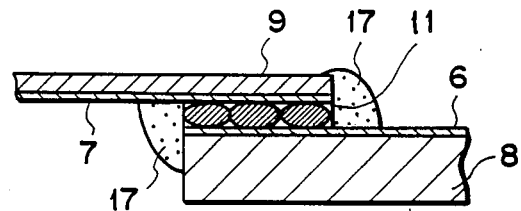
FIGS. 14 and 15 are an enlarged sectional view and perspective view, respectively, of an essential part of a fifth embodiment.
Figure 15:
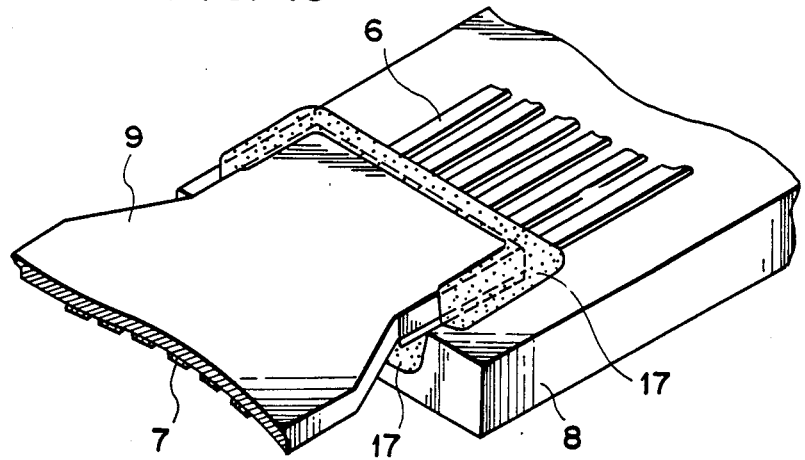

Furthermore, for purpose of secured reinforcement of the connection structure, a reinforcing adhesive resin 17 may be applied to a whole or part of an outer peripheral edge of the connected portions as arranged of a plurality of conductive track patterns 6 and conductors 7 as required, as shown in FIGS. 14 and 15.

Furthermore, in the case that it is preferred to use a soldering flux in bonding with the solder metal in the adhesive material 11, the flux may be contained in the coating material for the adhesive layer, or the metal powder may be preliminarily enclosed by the flux, or the flux may be applied to a surface of the conductors or conductive track patterns or a surface of the adhesive layer.

Further, a solder plating may be applied to either or both of the conductive track patterns and the corresponding conductors. However, the solder plating may be sufficiently thin because complete soldering by the solder plating is not required.

As is above described, since electrical connection between the conductive track patterns and the corresponding conductors is achieved mainly by meltbonding of metal, connection with low resistance may be secured. Accordingly, the present invention is advantageously applicable to the case of current driving mode where current is conducted through the connected portions. Further, since the areas between adjacent connected portions are filled with the insulating adhesive material, insulation between the connected portions may be secured even when a high-density wiring is employed where a pitch of the connected portions is greatly fine, thereby improving reliability and establishing a circuit board of higher density and fine pitch pattern.

Further, according to the present invention, an insulating adhesive layer containing a dispersed metal powder, or solder metal powder having a specific composition is interposed between the transparent electrode patterns of oxide and the corresponding conductive track patterns, and both the transparent electrode patterns and the corresponding conductive track patterns are electrically connected by soldering of the metal powder with heat and pressure, and simultaneously the areas between adjacent patterns are insulated by enclosing the metal powder existing in the areas with the insulating adhesive material. Accordingly, a connection resistance between the conductive track patterns may be rendered sufficiently small and an electrical insulation between adjacent conductive patterns may be satisfactory. Although it is generally difficult to electrically and mechanically connect a conductive film to a transparent conductive film of oxide, the present invention makes it possible to permit superior electrical and mechanical connection, and thereby to facilitate rendering of finer pitch of the patterns and mass production.

Further, in the case that a metal powder having an insulating film on a surface thereof is used, it is possible to more effectively prevent electrical connection accident between adjacent conductive track patterns, thus achieving more reliable connection.

What is claimed is:

1. An electrical connection structure comprising:
a first circuit board comprising a substrate having a first set of electrically conductive tracks formed thereon,
a second circuit board comprising a substrate having a second set of electrically conductive tracks formed thereon in confronting relation to said first set of electrically confronting tracks, and
an electrically conductive adhesive sheet bonding said circuit boards together to provide electrical conntinuity between said first and second sets of electircally conductive tracks, said adhesive sheet containing a uniformed dispersion of electrically conductive metal powder particles electrically insulated from each other by an electrically insulating meltable adhesive material, the powder particles located between the confronting sets of tracks being deformed and flattened while the powder particles in said sheet between said confronting sets of tracks being undeformed and unflattened, the deformed and flattened particles providing area contact between themselves and said confronting sets of tracks, the meltable adhesive having a melting point above the melting point of the metal powder particles and mechanically uniting said two sets of tracks together as a result of solidification from the molten state while under mechanical pressure.

2. The electrical connection structure according to claim 1, wherein said metal powder has a melting point between 50° C. and 350° C.

3. The electrical connection structure according to claim 1, wherein said metal powder has a melting point between 80° C. and 260° C.

4. The electrical connection structure according to claim 1, wherein said metal powder has an insulating layer on said metal powder particles.

5. The electrical connection structure according to claim 1, wherein said metal powder is made of an alloy mainly containing Pb and Sn.

6. The electrical connection structure according to claim 1, wherein said metal powder is solderable to a transparent conductive electrode made of oxides of indium and tin.

7. The electrical connection structure according to claim 1, wherein said metal powder is made of an alloy containing Pb and Sn and an additive selected from the group consisting of Zn and rare earth elements.

8. The electrical connection structure according to claim 1, wherein said adhesive sheet has a thickness between 5 microns and 200 microns.

9. The electrical connection structure according to claim 1, wherein said adhesive sheet contains 0.5 to 50 parts by volume of said metal powder with respect to 100 parts by volume of said adhesive material.

10. The electrical connection structure according to claim 1, wherein said adhesive material has a melt flow index not smaller than 0.001 at said elevated working temperature.

11. The electrical connection structure according to claim 1, wherein said adhesive material has a melt flow index not smaller than 0.005 at said elevated working temperature.

12. The electrical connection structure according to claim 1, wherein said adhesive material has resistivity not less than 10 ohm cm.

13. The electrical connection structure according to claim 1, wherein said second set of a plurality of conductive tracks is formed on a semiconductor integrated circuit chip.

14. The electrical connection structure according to claim 1, wherein said second set of a plurality of conductive tracks is a plurality of lead electrodes of electronic parts.

15. The electrical connection structure according to claim 14, wherein said electronic parts are a semiconductor integrated circuit.

16. The electrical connection structure according to claim 14, further comprising a flexible sheet covering connection portions of said first and said second tracks.

* * * * *